US011029351B1

(12) United States Patent
Tsironis (10) Patent No.: US 11,029,351 B1
(45) Date of Patent: Jun. 8, 2021

(54) TRANSFORMING LOAD PULL TEST FIXTURE FOR WAVE MEASUREMENTS

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 306 days.

(21) Appl. No.: 16/104,988

(22) Filed: Aug. 20, 2018

(51) Int. Cl.
*G01R 27/28* (2006.01)
*G01R 31/26* (2020.01)

(52) U.S. Cl.
CPC ......... *G01R 27/28* (2013.01); *G01R 31/2607* (2013.01)

(58) Field of Classification Search
CPC .............. G01R 31/26; G01R 31/2601; G01R 31/2607; G01R 31/2608; G01R 31/2822; G01R 31/2839; G01R 27/28
See application file for complete search history.

(56) References Cited

U.S. PATENT DOCUMENTS

| | | | | |
|---|---|---|---|---|
| 3,789,301 A * | 1/1974 | Malaviya | ........... | G01R 31/2608 324/762.08 |
| 4,912,402 A * | 3/1990 | Angelucci | ............. | G01R 1/045 324/750.25 |
| 6,281,697 B1 * | 8/2001 | Masuda | ............... | G01R 31/315 324/263 |
| 6,414,563 B1 | 7/2002 | Tsironis | | |
| 6,812,714 B2 * | 11/2004 | Verspecht | ............. | G01R 27/28 324/638 |
| 7,265,534 B2 * | 9/2007 | Majerus | ................ | G01R 27/28 324/756.07 |
| 7,282,926 B1 | 10/2007 | Verspecht et al. | | |
| 7,545,151 B2 * | 6/2009 | Martens | ................ | G01R 27/28 324/601 |
| 8,892,380 B2 * | 11/2014 | Simpson | ................ | G01R 29/26 702/69 |
| 8,947,113 B2 * | 2/2015 | Han | ....................... | G01R 1/045 324/750.02 |
| 9,214,718 B2 * | 12/2015 | Mow | ...................... | H01Q 5/328 |

OTHER PUBLICATIONS

"Test Fixture for Medium and High Power RF Transistors", Product Note 7, Focus Microwaves, Jan. 1994.
Time domain [online], Wikipedia [Retrieved on May 25, 2018]. Retrieved from Internet <URL: https://en.wikipedia.org/wiki/Time_domain>.

(Continued)

Primary Examiner — Walter L Lindsay, Jr.
Assistant Examiner — Milton Gonzalez (57) ABSTRACT

RF (Radio Frequency, typically 500 MHz to 18 GHz) microstrip transistor test fixture which includes impedance transforming microstrip sections to pre-match the device (DUT) and wideband bidirectional signal couplers able to detect forward and reflected power waves and feed into an amplitude and phase measuring signal analyzer (such as a vector network analyzer VNA). Impedance pre-matching in the fixture allows reaching impedances (tuning) down to below 1Ω and power-match the power transistors (DUT), whereas the tuners alone can barely reach impedances of 5Ω at the DUT reference plane. Placing the couplers on transforming sections close to the DUT also allows for detection of the travelling signal waves with the smallest possible disturbance.

7 Claims, 13 Drawing Sheets

(56) References Cited

OTHER PUBLICATIONS

Fourier inversion theorem [online], Wikipedia [Retrieved on May 28, 2018]. Retrieved from Internet <URL : https://en.wikipedia.org/wiki/Fourier_inversion_theorem>.
Differential amplifier [online], Wikipedia [Retrieved on May 28, 2018]. Retrieved from Internet <URL:https://en.wikipedia.org/wiki/Differential_amplifier>.
Klopfenstein taper [online], Microwaves101 [Retrieved on May 28, 2018]. Retrieve from Internet <URL:https://www.microwaves101.com/encyclopedias/klopfenstein-taper>.
Coaxial 50W 2-18GHz 16dB Directional Coupler [online], Datasheet [Retrieved on Jul. 18, 2018], RF Lambda. Retrieved from Internet <URL: https://www.rflambda.com/product_search.jsp?productname=RFDC2G18G16>.

\* cited by examiner

TRANSFORMING LOAD PULL TEST FIXTURE FOR WAVE MEASUREMENTS

PRIORITY CLAIM

Not applicable.

CROSS-REFERENCE TO RELATED ARTICLES

1. Tsironis, C. U.S. Pat. No. 6,414,563, "Low-loss microwave device test fixture with adjustable blocks".
2. "Test Fixture for Medium and High Power RF Transistors", Product Note 7, Focus Microwaves, January 1994.
3. Time domain [online], Wikipedia [Retrieved on 2018 May 25]. Retrieved from Internet <URL: https://en.wikipedia.org/wiki/Time_domain>.
4. Fourier inversion theorem [online], Wikipedia [Retrieved on 2018 May 28]. Retrieved from Internet <URL: https://en.wikipedia.org/wiki/Fourier_inversion_theorem>.
5. Verspecht et al. U.S. Pat. No. 7,282,926, "Method and an apparatus for characterizing a high-frequency device-under-test in a large signal impedance tuning environment".
6. Differential amplifier [online], Wikipedia [Retrieved on 2018 May 28]. Retrieved from Internet <URL:https://en.wikipedia.org/wiki/Differential_amplifier>.
7. Klopfenstein taper [online], Microwaves101 [Retrieved on 2018 May 28]. Retrieve from Internet <URL:https://www.microwaves101.com/encyclopedias/klopfenstein-taper>.
8. Coaxial 50W 2-18 GHz 16 dB Directional Coupler [online], Datasheet [Retrieved on 2018 Jul. 18], RF Lambda. Retrieved from Internet <URL: https://www.rflambda.com/product_search.jsp?productname=RFDC2-G18G16>.

BACKGROUND OF THE INVENTION

This invention relates to test fixtures used in load pull and time domain testing of RF transistors in microwave frequencies (see ref. 1 and 2).

Figure 1:
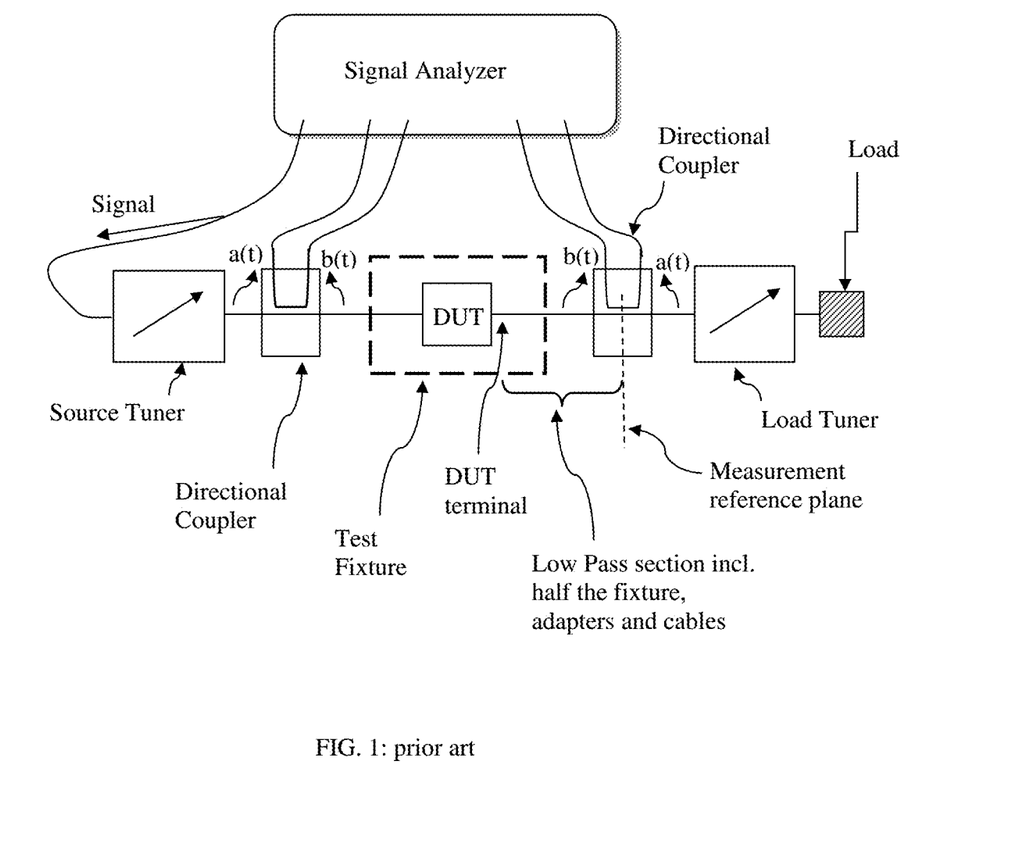
FIG. 1 depicts prior art: a load pull test system with signal waveform detection using couplers mounted outside the test fixture.

Active RF components (transistors—DUT) need to be thoroughly tested at the operation frequencies before used in amplifier and other circuit designs. "Load pull" and "Source pull" are test methods, which use impedance tuners to systematically characterize the DUTs under various load and source impedance conditions. Load pull or source pull are automated measurement techniques used to measure Gain, Power, Efficiency and other characteristics of the DUT, employing source and load impedance tuners and other test equipment, such as signal sources, directional couplers, test fixtures to mount the DUT (device under test, typically an RF transistor), directional couplers and signal analyzers (FIG. 1, see ref. 3).

Figure 8:
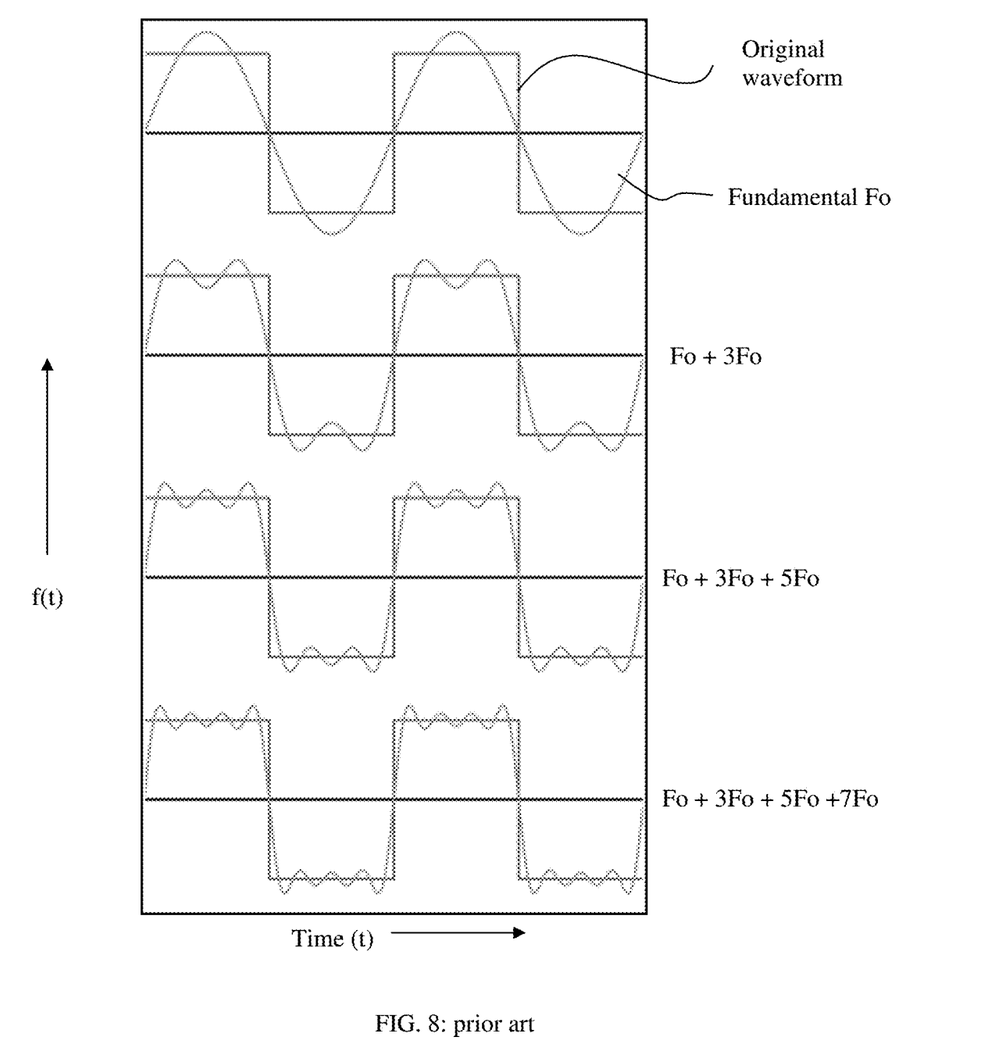
FIG. 8 depicts prior art: the approximation of a pulsed rectangle time domain waveform f(t) with harmonic Fourier components of increasing order.
Figure 9A:
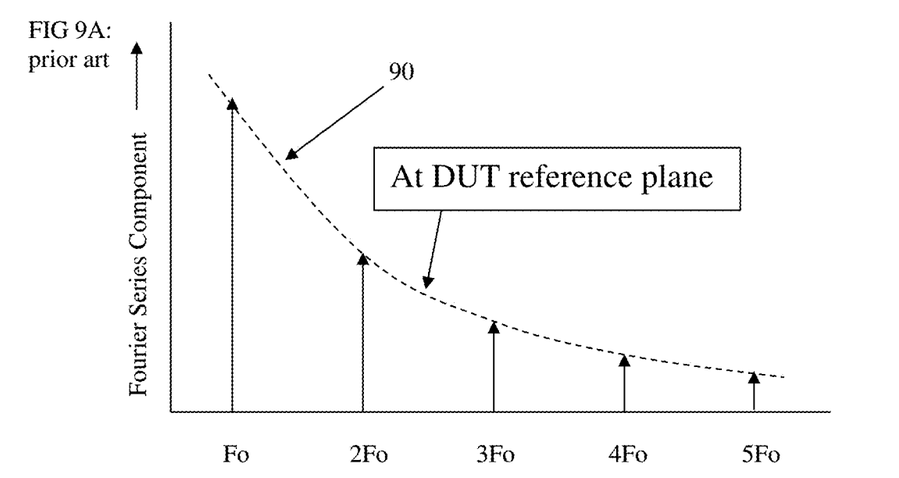
FIG. 9A depicts the harmonic components of an input signal at Fo when exiting the DUT at the DUT terminals.
Figure 9B:
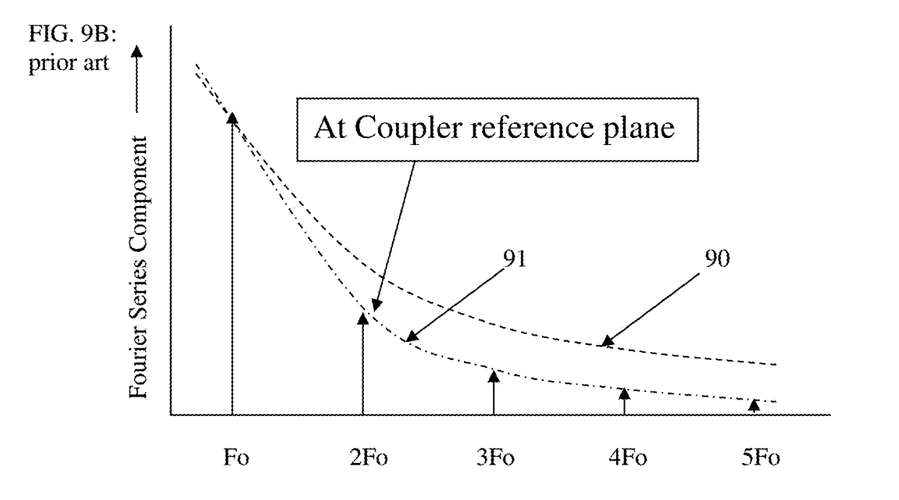
FIG. 9B depicts the harmonic components of the signal after traversing a low pass transmission section comprising microstrip line and adapters, normalized at the amplitude level of Fo. Harmonic component suppression increases with frequency.
Figure 12:
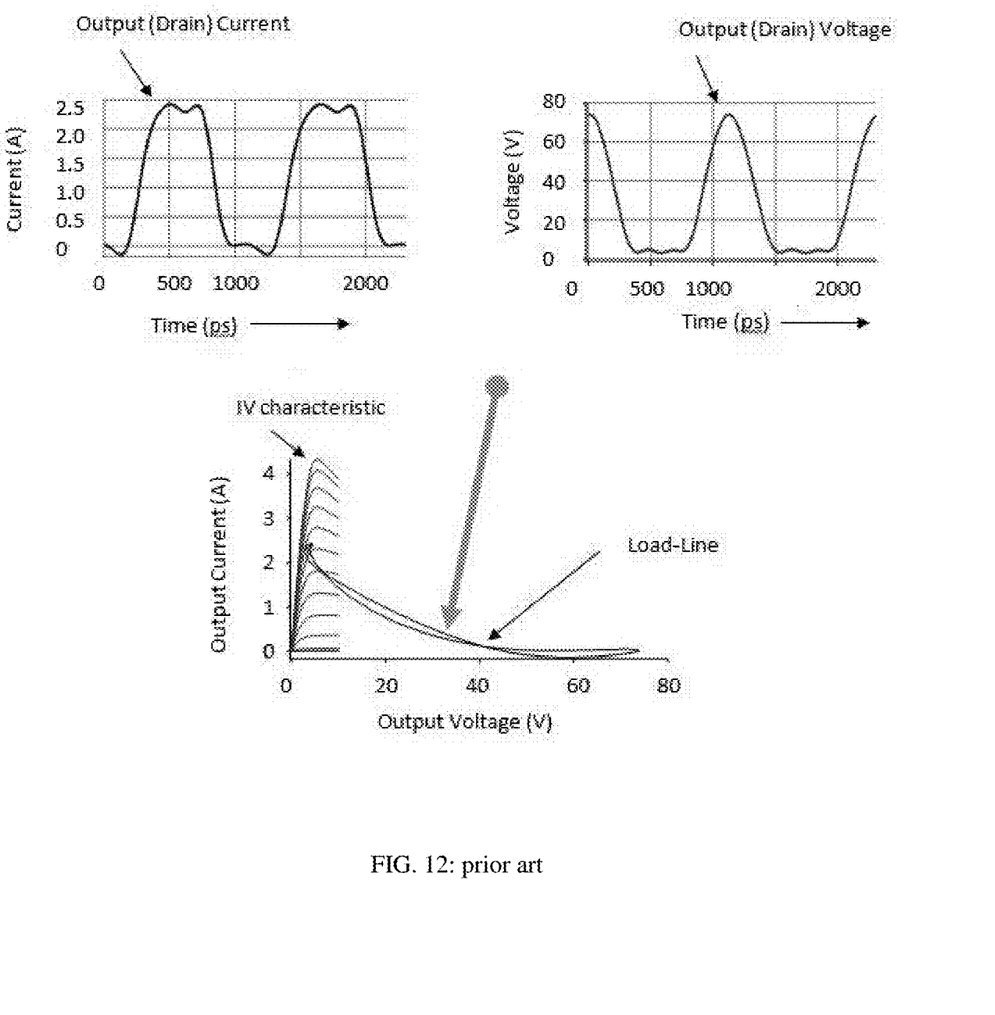
FIG. 12 depicts prior art: Load-Line of a power transistor and associated voltage and current waveforms in the time domain; time period shown ≈1100 ps corresponding to Fo≈0.9 GHz.

At high power the RF transistors have very low internal impedance, typically output impedance of 1 to 3Ω, and become "non-linear", i.e. input and output signals are related, but not any more directly proportional. A single frequency (Fo) sinusoidal signal at the input of the DUT is distorted at the output (see FIG. 12), meaning that, when exiting the DUT, the signal contains "harmonic components" (see FIG. 9). Periodical signals, sinusoidal or not, can be described as a Fourier series of the fundamental (Fo) and harmonic (N*Fo) frequency components (see ref. 4 and FIG. 8). The wave-form of the exiting signal depends on the operation conditions of the transistor, especially the impedance of the load (see FIG. 12).

Figures 11A, 11B:
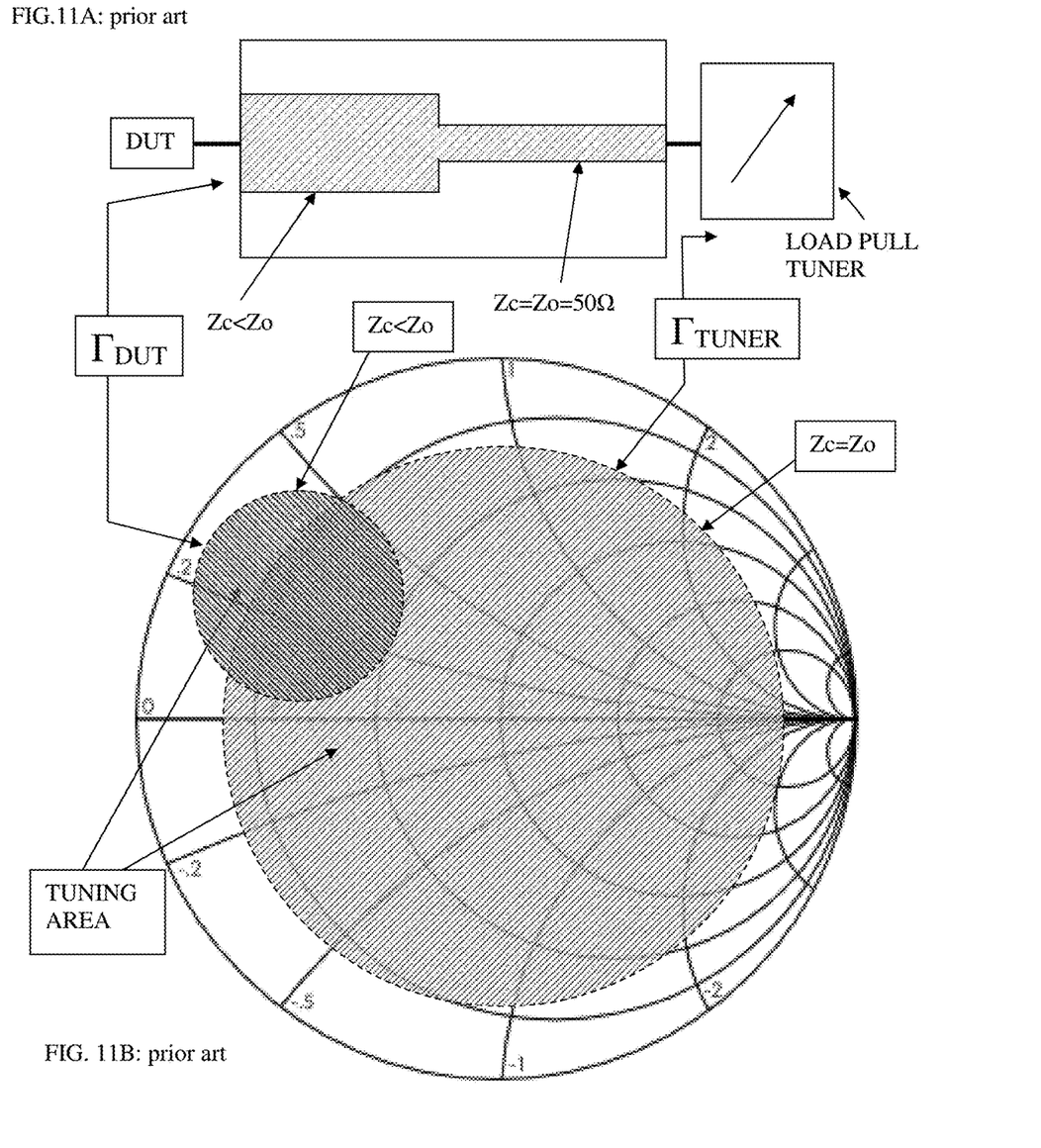
FIG. 11A depicts a transforming test fixture attached to a load pull tuner.
FIG. 11B depicts the tuning area, seen at the tuner test port ($\Gamma_{TUNER}$) and at the DUT ($\Gamma_{DUT}$) reference plane, through a transforming test fixture with Zc<Zo.
Figure 13:
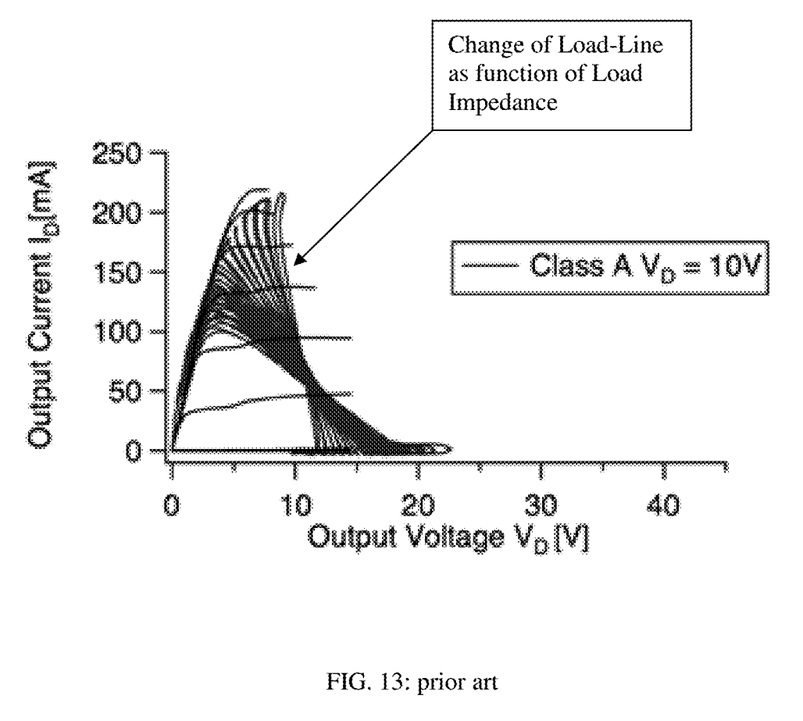
FIG. 13 depicts prior art: Variation of Load-Line as a function of load impedance.

The trajectory of the voltage across the Drain-Source IV (current-voltage) characteristic of the transistor is called the "load-line" (see FIG. 12) and depends strongly on the load impedance (see FIG. 13), which is controlled by the impedance tuners ($\Gamma_{DUT}$ and $\Gamma_{TUNER}$ in FIG. 11), causing high non-linearities and strong harmonic content of an, originally, single frequency sinusoidal signal. The load-line determines the efficiency, linearity and operational reliability of the transistor and amplifier. This is the main reason why the signal waveforms must be detected and optimized. In order to be able to observe the actual signal waveform at the DUT terminals in the time domain, whereas the measurement occurs at a different position in the network, we must transform the signals from the measurement reference plane to the DUT reference plane. This is possible only in the "frequency domain"; i.e. we must convert the wave time function f(t) into a Fourier series of harmonic signals, using the fundamental and harmonic components generated by the Fourier transformation (eq. 1) and apply the reference plane transformation (correction) frequency by frequency first. An inverse Fourier transformation (see ref. 4), then, allows transforming the corrected frequency domain representation back to the time domain:

$$f(t) = \frac{a_0}{2} + \sum_{k=1}^{\infty}\left(a_k \cos\frac{k\pi t}{\lambda} + b_k \sin\frac{k\pi t}{\lambda}\right) \quad \text{(eq.1)}$$

Hereby f(t) is the original time function (in the case of a transistor DUT, these are the voltages $V_1(t)$, $V_2(t)$ and currents $I_1(t)$ and $I_2(t)$ at the input and output terminals of the transistor correspondingly), a(t) and b(t) are the injected and extracted (reflected) signal waves: $a_k$ and $b_k$ the amplitudes of their harmonic components at frequencies k*Fo and λ is the wavelength at the given fundamental frequency (λ(mm)≈300/F(GHz)), wherein F is the frequency. To be able to measure the real shape of the non-sinusoidal signals V(t) and I(t), which we define as "wave measurement" we must measure in the frequency domain the amplitude and phase of the fundamental and harmonic frequency components and convert back to the time domain. To do so we must detect those frequency components using signal samplers also called directional couplers (see FIG. 1) and measure their amplitude and phase using appropriate signal analyzers.

Figures 3A, 3B:
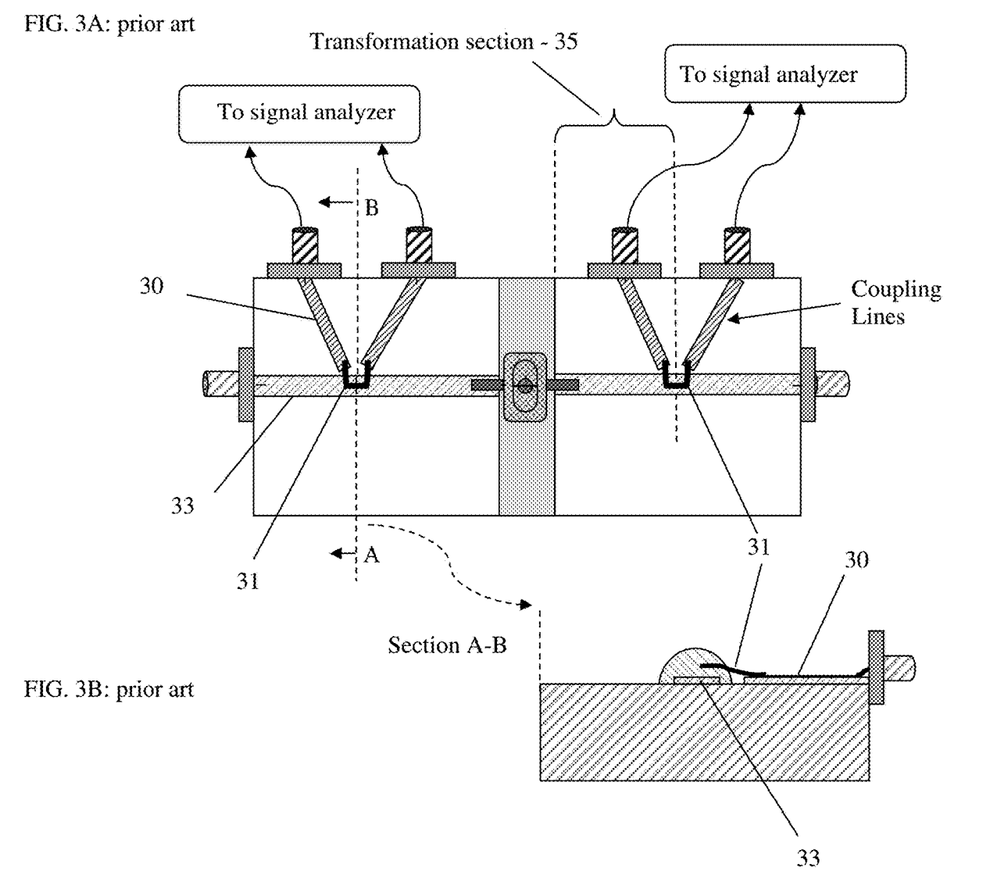
FIG. 3A depicts a top view of the entire fixture.
FIG. 3B depicts a cross section of a microstrip line and signal coupler made using a wire bridge.

It is obvious (see FIG. 8) that, the higher the number of harmonics considered, the more accurate the description of the time behavior of the original signal becomes. This means, however that, as the harmonic components traverse the network, and because all networks have "low pass" behavior (trace 90 in FIG. 9A), higher harmonic components will be suppressed more than lower ones (trace 91 in FIG. 9B) meaning that the signal is "smoothed". In other words, the form of a non-sinusoidal signal changes as it travels along a "low pass" transmission line. By transforming back ("embedding") the signal harmonic components, measured by the signal analyzer, with the transfer matrix between the measurement point and the DUT, will reconstitute the original signal form. However parasitic components and strong low pass behavior of the network reduce the higher harmonic components over-proportionally (FIG. 9B); then reconstitution of the original signal form is affected negatively. True reconstitution requires very high accuracy both of the measurement at the deferred position and the transfer matrix of the transformation section 35 in FIG. 3, resp. 51, 52 in FIG. 5, between the measurement position and the DUT terminals. This is the typical problem in analog telephony and associated distortion of the higher tones (harmonics) in voice or music transmission. Therefore, the closer physically the actual measurement reference plane to the DUT is, the easier and more accurate will the reconstitution of the original signal waveform be.

BRIEF DESCRIPTION OF THE INVENTION

This invention discloses an RF (Radio Frequency, typically 500 MHz to 18 GHz) microstrip transistor test fixture which comprises impedance transforming microstrip sections to pre-match the device (DUT) and wideband bidirectional signal couplers able to detect forward and reflected power waves and feed into an amplitude and phase measuring signal analyzer (such as a vector network analyzer VNA). Since the signal analyzer processes the detected signal in the frequency domain, it is easily possible to correct the measurement reference plane from the location of the couplers to the DUT terminals, and thus re-construct the real time domain shape of the voltage and current at the DUT reference plane. In order to increase measurement accuracy the couplers are to be placed as close to the DUT as physically realistic, and are coupled electro-magnetically to the transforming sections of the main microstrip line. This allows frequency domain measurement of the harmonic components of the deformed (because of DUT non-linearities) signal waves, de-embed back to the DUT reference plane, convert back and visualize the voltage and current wave forms (see FIG. 12). It also allows optimizing the transistor's load-line operation using the attached impedance tuners. Impedance pre-matching in the fixture allows reaching impedances (tuning) down to below 1Ω and power-match the power transistors (DUT), whereas the tuners alone can barely reach impedances of 5Ω at the DUT reference plane. Placing the couplers on transforming sections close to the DUT also allows for detection of the travelling signal waves with the smallest possible disturbance.

BRIEF DESCRIPTION OF THE DRAWINGS

The invention and its mode of operation will be better understood from the following detailed description when read with the appended drawings in which:

FIG. 2A through 2B depict prior art: top and side views of a micro-strip transistor test fixture comprising an impedance transforming section on the output half; FIG. 2A depicts a top view; FIG. 2B depicts a side view.

FIG. 3A through 3B depict prior art: A micro-strip transistor test fixture with integrated signal detection couplers attached to microstrip lines.

FIG. 4A through 4B depict data and signal coupler coupled to the transforming section of micro-strip transistor test fixture.

FIG. 7A through 7B depict the electric and magnetic field lines in the wire-bridge signal coupler and transforming microstrip associated signal flow.

FIG. 9A through 9B depict prior art.

FIG. 11A through 11B depict prior art.

DETAILED DESCRIPTION OF THE INVENTION

At high frequencies most electronic equipment, such as signal and network analyzers, operate in the frequency domain. In the frequency domain it is also easy to shift the reference plane of the measurement (em- and de-embedding). In order to sample the signal's harmonic components over a wide frequency range (the more harmonic components are known, the more accurate is converting between the time and frequency domain of a signal, see FIG. 9) we need wideband signal directional couplers. Though couplers can be connected on both sides outside of the test fixture in which the DUT is mounted (FIG. 1) this creates additional correction effort, because such a setup includes, in addition to half the test fixture, also connectors, adapters and transmission lines between the DUT and the couplers and suffers from higher insertion loss and low pass behaviour (see FIG. 9); it therefore creates additional considerable signal deformation due to parasitic components of the connectors and the other fixture parts. This suppresses the detectable signals, especially at the harmonics, and causes the necessary reference plane corrections to be larger and therefore increases correction inaccuracies. It is therefore beneficial to position the signal couplers and signal detection as close to the DUT as possible, before these disturbing low-pass parasitical effects; this leads to the incorporation of the couplers inside the fixture.

Figures 2A, 2B:
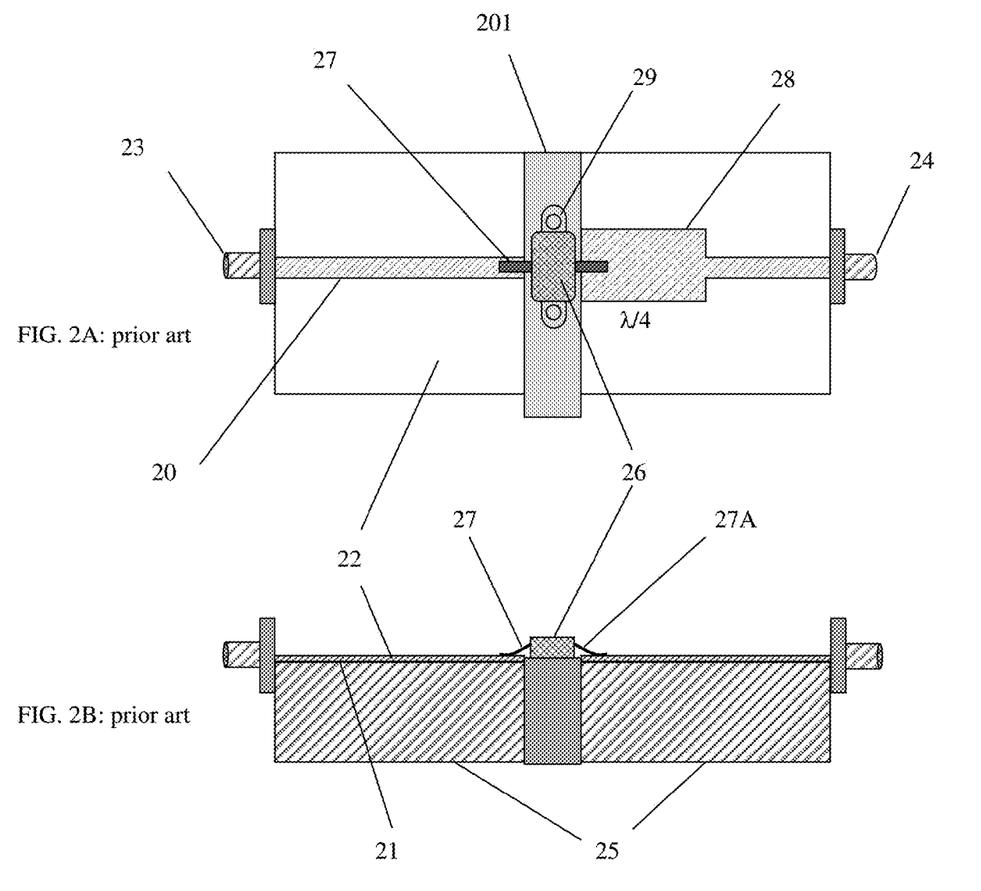

The majority of regular transistor test fixtures, FIG. 2, come in form of metallized dielectric sheets (substrates) mounted on metallic blocks 25, and having one or more conductive strips 20 formed through photolithographic definition and chemical etching on the top surface and a continuous metallized ground plane 21 on the bottom side of the dielectric substrate 22. The transistors (DUT) are mounted on insertable metallic blocks 201 between the input and output support blocks 25. The three blocks are not necessarily separated. It is possible to design test fixtures all made on the same piece of metal, in which case calibration shall use additional substitute test fixture dummies. In the present situation, though, wherein couplers are included in the fixture and must calibrated as well, using calibration substitutes is impractical, because it is difficult to duplicate the couplers ensuring accurate calibration.

To test very low internal impedance (power) transistors the test fixtures come with pre-matching impedance transforming sections 28. The characteristic impedance Zc of those sections is typically between 10 and 20Ω. If those sections are one quarter wavelength long (λ/4) then then a 50Ω load at port 24 is transformed to an impedance Z seen by the DUT as: Z=sqrt (Zc*50)Ω. In the case of Zc=5Ω we get Z=sqrt (250)≈15.8Ω. A tuner attached to port 24 will then tune around 16Ω, instead of 50Ω (see FIG. 11). The test fixture can be enhanced by adding signal couplers 30, 31, 54 inside the enclosure of the test fixture and close to the DUT (FIGS. 3 and 5); the directional signal sampling (FIG. 4) is created through capacitive (electric) or inductive (magnetic) coupling of a set of conductive wire bridges 41 or narrow strip high impedance conductor sections 53 to the main signal transmission line 40, 50. When the coupling loop 41 is placed near the low characteristic impedance section 40 it disturbs the field less than if it is placed 31 close to the 50Ω line 33, because of the lower current density and magnetic field in section 40. This is an additional benefit of the structure. The length of the coupled sections, being it wire bridges 41 or narrow strips 53 determine the frequency coverage of the couplers. Long sections produce high coupling at low frequencies and low cut-off frequencies, short sections produce low coupling at low frequencies and high cut-off frequencies. The gap between conductors in both cases determines the basic level of coupling factor. In the case of bridges 41 this is adjustable post manufacturing, in the case of strips 53 it is fixed and must be designed for.

Figure 10:
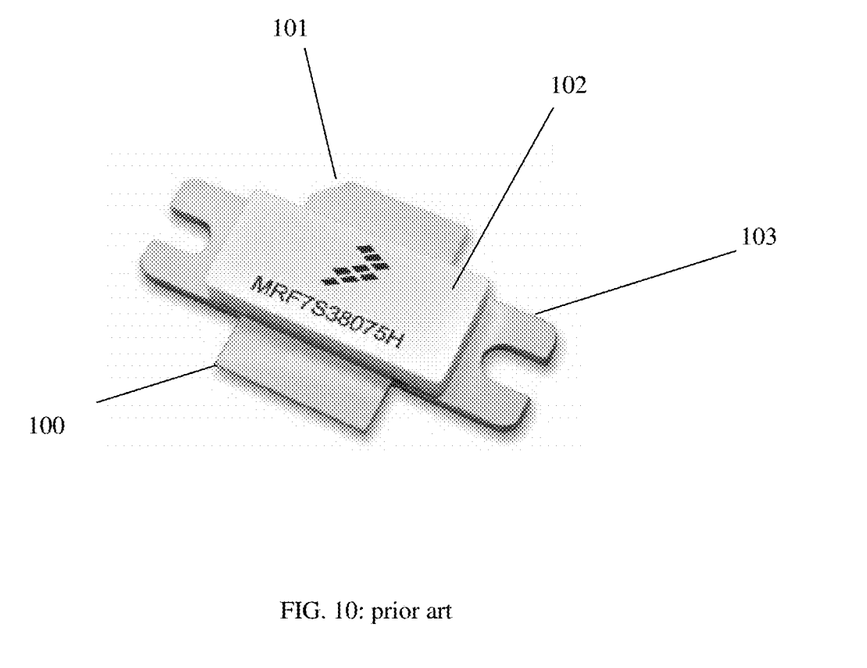
FIG. 10 depicts prior art: A single-ended (one input and one output terminal) packaged RF power transistor.

A typical transforming micro-strip (MS) transistor test fixture (FIG. 2) comprises at least two coaxial signal test ports, at least one input port 23 and at least one output port 24. A dielectric substrate 22 is soldered or mechanically secured tightly on input and output metallic blocks 25 which serve as electrical ground and heat sink for the thermal energy dissipated by the DUT (transistor) 26. The signal travels on the micro-strip conductor(s) 20 from the input port (connector) 23 to the input terminal (lead) 27 of the transistor and from the output terminal (lead) 27A to the output port (connector) 24 via an impedance transforming section 28. Transforming sections are used mainly at the output but often also at the input. The transistors need pre-matching with the transformers at both input and output, but at the output the high output power is more valuable. There exist transistors with more than one input and/or output terminals, such as differential transistors (see ref. 6); in this case what is valid for one pair of ports is valid and applicable for the other pair of ports as well. The transistor package shown in FIG. 10 is a typical example of single-ended (one input 101 and one output 100 terminal) high power RF transistor. A heat resistant dielectric ceramic package 26, 102 houses and protects the transistor semiconductor chip inside. The ground terminal of the DUT (typically the transistor source, in case of a field-effect-transistor, or emitter, in case of a bipolar transistor) is connected to a metallic support 103, which is mounted tightly 29 with screws or clamps on the insert 201 of the test fixture. The inserted block can be replaced by another one of different form or size holding a different transistor package or replaced temporarily with calibration standards for calibrating the fixture (see ref. 2).

Figure 6:
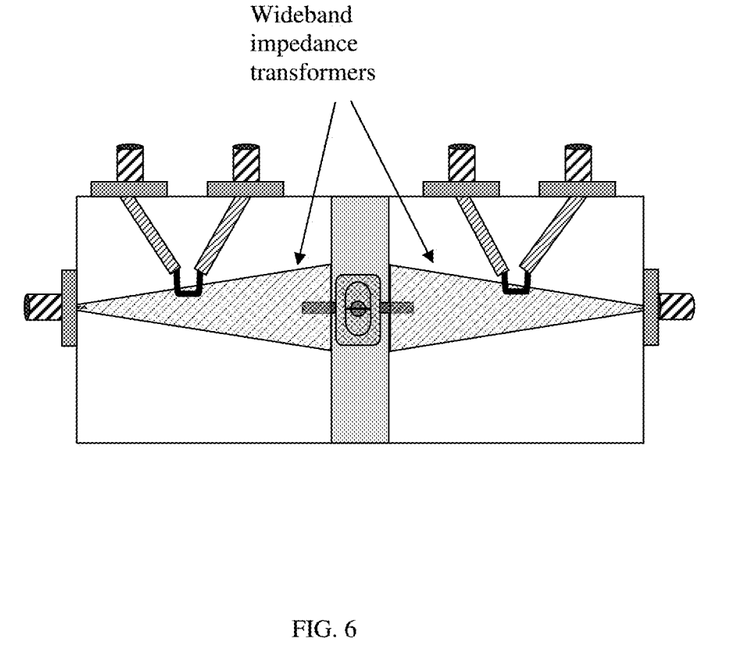
FIG. 6 depicts a test fixture with input and output wideband impedance transforming sections and integrated wire bridge couplers.
Figure 7A:
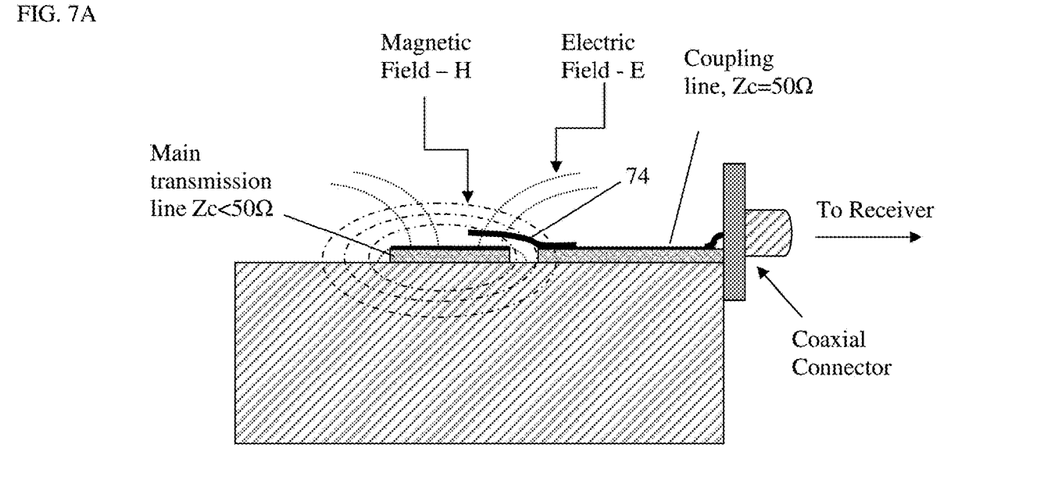
FIG. 7A depicts a cross section.

FIG. 4 shows measured data of a typical signal coupler, made on a transforming micro-strip test fixture, loaded with a 50Ω load resistance, using a coupled wire loop 41 over a frequency range of 1 to 11 GHz. All the signal couplers disclosed here are, in fact, bi-directional, i.e. they sample portions of both, the forward a(t) and the reverse (reflected) b(t) power wave on the transmission line (see FIGS. 4 and 7). The coupling structure is the same as in FIGS. 3, 6 and 7. The signal enters in port [1] and exits through port [4]. Part of the signal is coupled forward to port [2] and another part is "leaked" into port [3]. No power is coming back from port [4] since it is loaded with the characteristic impedance 50Ω of the micro-strip line. If power comes back, since the load is not 50Ω, it is detected as power wave b(t) by ports [3] as forward and port [2] as isolated ports. The forward coupling factor S21 is shown to vary from −50 dB to −10 dB and the associated reverse coupling factor S31 from below −70 dB to −15 dB. The associated "directivity" varies therefore from >25 dB to slightly over 5 dB correspondingly. The same relations occur in reverse direction (coupling S34 and isolation S24 correspondingly).

Figure 4A:
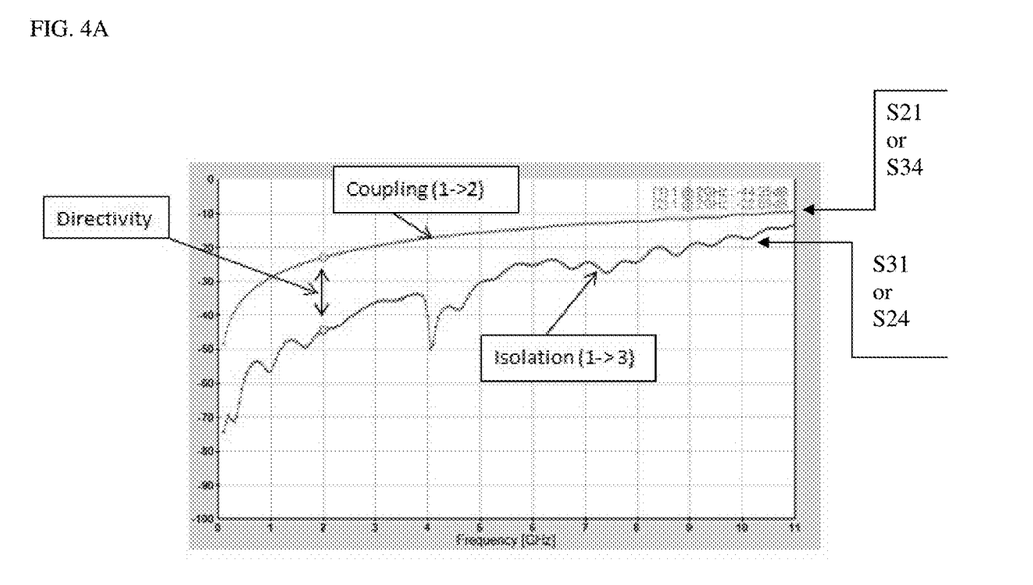
FIG. 4A depicts typical measured frequency dependent coupling and isolation data of the signal coupler in the fixture.
Figure 4B:
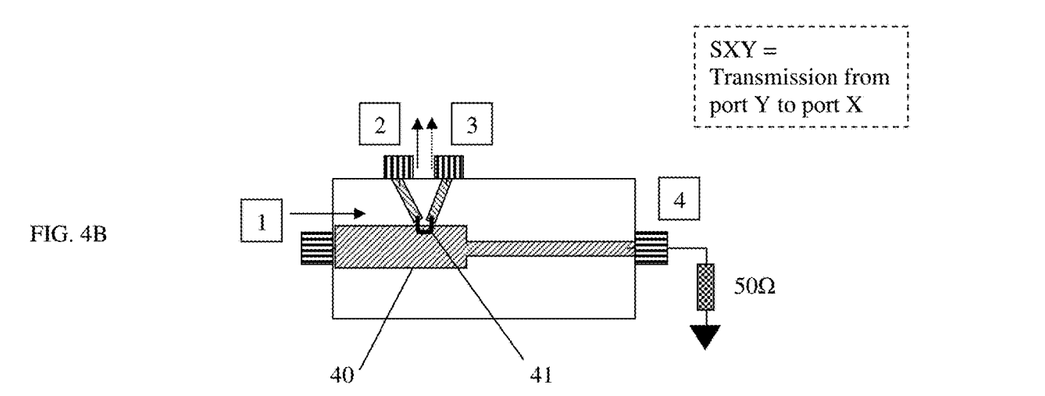
FIG. 4B depicts a top view of the fixture and definitions of ports and coupling coefficients.
Figure 5:
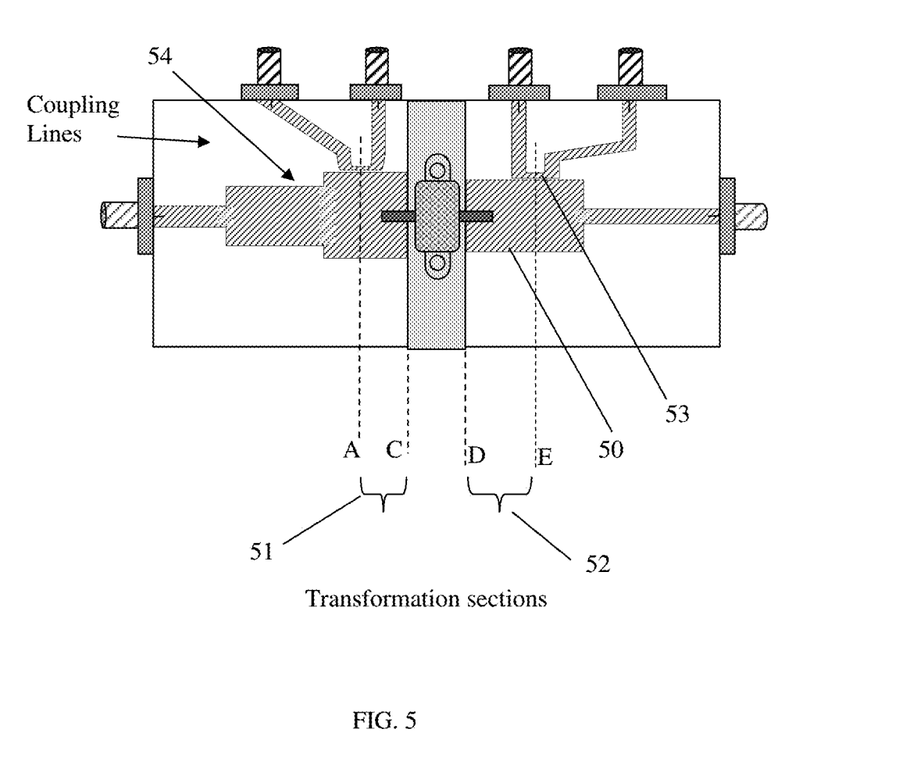
FIG. 5 depicts a transforming test fixture with double step input and single step output impedance transforming sections as well as associated signal couplers.

The signal couplers comprise two traversal, typically 50Ω, micro-strip coupling lines leading to coaxial connectors and joined on one end by a wire bridge 31, 41 overhanging over the micro-strip (FIGS. 4B and 6) or a narrow micro-strip section 53, placed adjacent and coupled electromagnetically to a transforming transmission line section (FIG. 5). The narrow micro-strip sections are typically approximately 10 times narrower than 50Ω micro-strip lines (1 mm strip width corresponds to 112Ω, compared with 8.1 mm corresponding to 50Ω on typical Teflon ($\varepsilon_r$=2.4) of 2 mm thick substrate) and approximately 20 times narrower than 22 mm wide 25Ω lines. The main reason for the narrow width is to create a highly inductive behavior and strong magnetic coupling, similar to the bridge 31. The couplers can be incorporated in transforming and non-transforming test fixture structures as shown in FIGS. 3 to 6. In the test fixtures of FIGS. 3, 4 and 6 the signal couplers are using wave coupling (see ref. 5) through wire bridges, whereas in the case of test fixture of FIG. 5 the electromagnetic coupling occurs through coupled microstrip lines 53. The FIG. 5 technique allows well controlled and reproducible, but not adjustable coupling, and is manufactured using photolithographic techniques on standard substrates. The FIG. 4 technique, applied also to wideband transforming networks (FIG. 6, see ref. 7) are hand-made, less controlled, but they allow in-situ coupling adjustment. In either coupling case (FIG. 4, 5 or 6) the detected waves a(t), b(t) and associated voltage v(t) and current i(t) can be converted into each-other using equation 1.

Figure 7B:
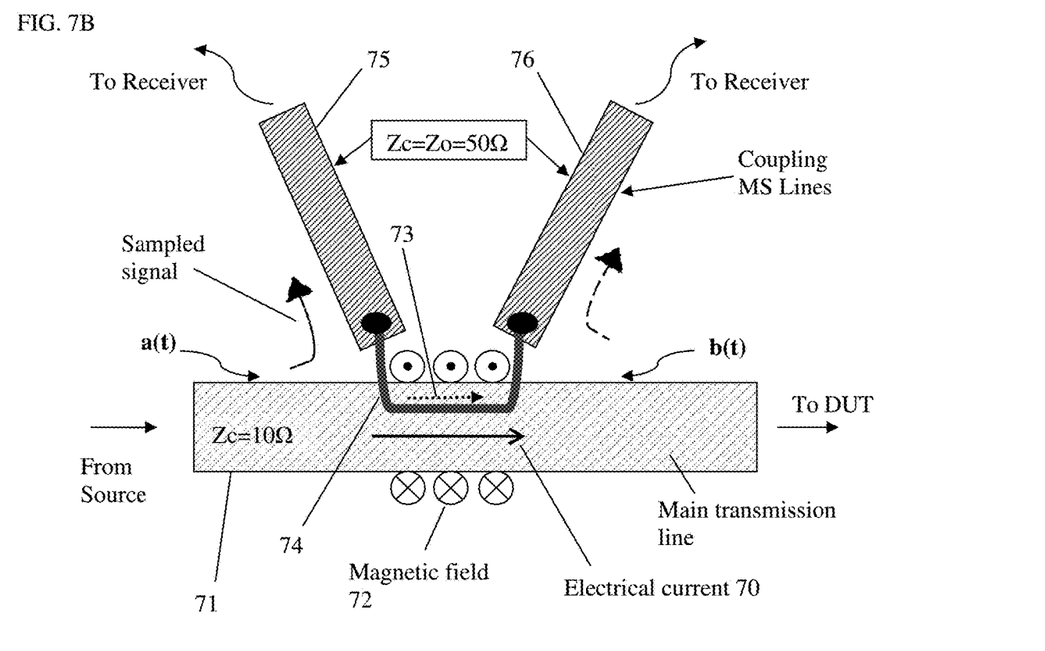
FIG. 7B depicts a top view.

The magnetic field 72, caused by the electrical current 70 of the forward power wave a(t), induces a coupled current 73 inside the wire-bridge 74. This current has two components, one magnetically induced by the magnetic field 72 and one generated by the voltage drop along the line 71 due to capacitive coupling of the bridge 74 with the line 71. Both induced currents add in direction of the coupled port 75 and subtract in direction of the isolated port 76. The inverse happens with the reverse power wave b(t). A concrete benefit of using transforming test fixtures (FIGS. 4, 5 and 6) is that the DUT is pre-matched. This means the reflected power wave b(t) in FIG. 7B is strongly reduced. This reflected wave is not only detected by the reverse coupling branch 76, but it is also leaking into the forward coupling branch 75 (S24 in FIG. 4A is not zero). This creates enhanced requirement for accurate de-embedding and corrections m measurement, especially when the Directivity (FIG. 4A) is low, in this case above 5 GHz.

In all cases outlined before the actual coupling is increasing with frequency (FIG. 4A). This is an inherent advantage of this kind of signal coupler compared with "flat response" couplers (see ref. 8). Increasing coupling with frequency allows sampling a higher portion of the harmonic signal components which are lower than the fundamental frequency (see FIG. 9) and thus further compensating low pass characteristics of the fixture transmission line, which suppresses high frequency harmonic components resulting in an enhancement of the overall sensitivity of the measurement.

Although the present invention has been explained hereinabove by way of a preferred embodiment thereof, it should be pointed out that other combinations of the described components are possible and, as far as obvious to a person skilled in the art, they shall not limit the scope of the present invention.

What I claim as my invention is:

1. An impedance transforming test fixture with signal couplers for time domain measurement of RF transistors (device under test, DUT), comprising:
   an input metallic block with an input test port, an output metallic block with an output test port and
   a metallic block inserted between the input and output blocks, on which a DUT is mounted, and
   a main transmission line connecting the input test port with an input terminal of the DUT, and an output terminal of the DUT with the output test port,
   wherein
   the main transmission line comprises:
   one or more transforming section(s) with characteristic impedance Zc, lower than the characteristic impedance Zo of the transmission line, and signal coupler(s),
   and wherein
   the coupler(s) is/are placed close to the DUT, between the input and/or output test port and the associated DUT terminal, and is/are electro-magnetically coupled to the transforming section(s) in a non-contacting relationship,
   whereby
   the signal coupler(s) sample(s) a portion of a transmitted signal and can be operationally connected with a signal analyzer to measure the portion of the transmitted signal.

2. The test fixture of claim 1, wherein
   all supporting input and output parts of the fixture are metallic blocks, whereby
   sheets of dielectric substrate, carrying micro-strip lines, are mounted and secured on the input and output parts.

3. The test fixture of claim 1, wherein
   at least one transforming section is approximately one quarter wavelength ($\lambda/4$) long.

4. The impedance transforming test fixture with signal couplers of claim 1 wherein
   the signal coupler(s) comprising:
   two traversal micro-strip coupling lines, both placed on one side of and non-contacting the main transmission line, between the main transmission line and associated coaxial connectors attached to the fixture,
   and one wire bridge joining the coupling lines in the proximity of, and overhanging above the transforming section of the main transmission line,
   wherein
   one end of the first coupling line is connected to one end of the wire bridge and the other end of the first coupling line is connected to the associated coaxial connector
   and wherein
   one end of the second coupling line is connected to the other end of the wire bridge and the other end of the second coupling line is connected to the associated coaxial connector.

5. The impedance transforming test fixture with signal couplers of claim 1 wherein
   the directional coupler(s) comprise:
   two traversal micro-strip coupling lines, both placed on one side of the transmission line, between the transmission line and coaxial connectors attached to the fixture,
   and one narrow microstrip section joining the coupling lines and placed adjacent to the transforming section of the main transmission line,
   wherein
   one end of the first coupling line is connected to one end of the narrow micro-strip section and the other end of the first coupling line is connected to the associated coaxial connector,
   and wherein
   one end of the second coupling line is connected to the other end of the narrow micro-strip section and the other end of the second coupling line is connected to the associated coaxial connector.

6. The test fixture of claim 4 or 5 comprising:
   two signal couplers, one placed between the input test port and the DUT input terminal and one placed between the DUT output terminal and the output test port.

7. The test fixture of claim 4 or 5,
   wherein the traversal micro-strip lines have characteristic impedance of approximately Zo=50 Ohm.

* * * * *